United States Patent [19]
Bergmans et al.

[11] Patent Number: 5,461,644
[45] Date of Patent: Oct. 24, 1995

[54] ADAPTIVE VITERBI DETECTOR

[75] Inventors: Johannes W. M. Bergmans, Eindhoven, Netherlands; Kevin D. Fisher, Palo Alto, Calif.; Ho W. Wong-Lam, Eindhoven, Netherlands

[73] Assignee: U.S. Philips Corporation, New York, N.Y.

[21] Appl. No.: 86,814

[22] Filed: Jul. 2, 1993

[30] Foreign Application Priority Data

Jul. 3, 1992 [EP] European Pat. Off. ............. 92202028

[51] Int. Cl.$^6$ ................................................. H04L 27/06
[52] U.S. Cl. .............................................. 375/341; 371/43
[58] Field of Search ................................ 375/39, 94, 99, 375/101, 102; 371/43, 44, 45

[56] References Cited

U.S. PATENT DOCUMENTS

| | | | |
|---|---|---|---|
| 4,847,871 | 7/1989 | Matsushita et al. | 375/94 |
| 5,131,011 | 7/1992 | Bergmans et al. | 375/101 |
| 5,285,480 | 2/1994 | Chennakeshu et al. | 375/94 |
| 5,332,402 | 6/1994 | Ushirokawa | 375/94 |

OTHER PUBLICATIONS

Wood et al., "Viterbi Detection of Class IV Partial Response on a Magnetic Recording Channel", IEEE Transactions on Communications, vol. COM-34, No. 5, May 1986, pp. 454–461.

Bellanger et al., Adaptive Digital Filters & Signal Analysis, Chap. 4: Gradient Adaptive Filters, pp. 97–130.

Bergmans et al., "On the Use of Decision Feedback for Simplifying The Viterbi Detector", Philips J. Res. Vo. 42, No. 39, 1987, pp. 399–428.

Primary Examiner—Stephen Chin
Assistant Examiner—Don N. Vo
Attorney, Agent, or Firm—Anne E. Barschall

[57] ABSTRACT

Viterbi detector for a channel having a memory length 1, where no more than two survivors with an associated difference metric are updated. In the prior-art Viterbi detector of this type the new difference metric is from the previous difference metric by use of a saturation function. If the channel parameters differ from the values assumed for the calculation of the difference metric, the performance of the prior-art detector will rapidly degrade. In the detector according to the invention the new difference metric is derived from a combination of the saturation function of the previous difference metric and a correction signal which is a measure for the channel parameter difference.

10 Claims, 4 Drawing Sheets

ADAPTIVE VITERBI DETECTOR

BACKGROUND OF THE INVENTION

The invention relates to a transmission system comprising a data transmitter for supplying with a symbol interval data symbols to an input of a channel and a data receiver comprising a means for deriving a detection signal from an output signal of the channel, a means for deriving from the detection signal the most likely sequence of data symbols carried by the detection signal by recursively updating two candidate data sequences (survivors) on the basis of the value of a difference metric which is a measure for the probability difference of the survivors, the detection means furthermore including an adapting means for updating the difference metric, the new difference metric depending on a saturation function of the previous difference metric, and the saturation function for an ordinate value interval being equal to the identity function.

The invention likewise relates to a receiver to be used in a system of this type.

A transmission system as defined in the opening paragraph, as well as a receiver for this system is known from the journal article "Viterbi Detection of Class IV Partial Response on a Magnetic Recording Channel" by R. G. Wood and D. A. Peterson in IEEE Transactions on Communications, Vol. COM-34, No. 5, May 1986.

Transmission systems of this type may be used, for example, for transmitting data signals through the public telephone network or for reconstructing data signals from a magnetic tape or disc.

When data symbols are transmitted via a transmission medium or stored on a recording medium respectively, the data symbols to be transmitted or recorded respectively, are convened into analog pulses which are consecutively fed to the transmission medium or recording medium respectively.

Generally, there is provided that the analog pulses do not overlap in time. If the medium has a limited bandwidth, the pulses will start overlapping which in many cases will lead to the fact that the value of the received detection signal not only depends on a single data symbol at a given instant, but also on data symbols neighbouring in time. This effect is termed intersymbol interference.

Intersymbol interference may be caused not only by a limited bandwidth of the medium, but also by the use of a band limiting filter on the transmitter side which is used for giving a desired shape to the frequency spectrum of the transmitted or recorded analog pulses. The presence of intersymbol interference will often lead to an enhancement of the bit error rate.

An optimum receiver which would (substantially) completely eliminate the influence of intersymbol interference, would determine any possible sequence of transmitted data symbols and would determine the associated detection signal which would have been received if the relevant sequence of data symbols had been transmitted through a noise-free channel. By comparing with the current detection signal all the detection signals thus obtained, the most likely sequence of transmitted data symbols could be determined. Such a receiver, however, would require an impracticably large computer and storage capacity.

In order to reduce this required computer and storage capacity, a commonly termed Viterbi detector is often used. In this detector the most likely sequence of transmitted data symbols is determined by recursively updating a limited number of $M=L^{N-1}$ survivors, in which L is the number of levels of the transmission or recording signal used, and in which N is the channel impulse response length expressed in numbers of samples. This number is necessary, because the channel may occur in M states, whereas the receiver is to be capable of distinguishing between the states.

Once the M survivors with associated probability measures have been determined, each survivor, when a next data symbol is received, is extended and split up into a plurality of survivors of which only the most recently appended data symbols are different. The probability measure belonging to each new survivor is derived from the probability measure of the survivor from which the new survivor is derived and from an even function belonging to this new survivor of the difference between the current detection signal and the expected detection signal. Suitable even functions are the commonly termed $L_1$ norm ($|x|$) and the $L_2$ norm ($x^2$) in which the $L_2$ norm is used the most.

For assuring that the necessary storage capacity and computer capacity remains independent of the length of the sequence of transmitted data symbols, for each of the different possible channel states only the survivor is saved that is the most likely. Although a Viterbi detector already requires reduced computer and storage capacity, this capacity is nevertheless rather substantial.

In aforementioned journal article a further simplification of the Viterbi detector is proposed which is possible if no more than two survivors need to be updated. This is the case if the number of possible values L of the transmission signal or recording signal is equal to two, and if the transfer is equal to 1+D or 1−D, where D represents a one symbol interval delay of the channel input signal. Since in this situation no more than two survivors need to be updated, it may be sufficient in lieu of updating a probability measure for each survivor, to update no more than one difference metric which is a measure for the difference between the two survivors. The known Viterbi detector, however, may also be used for channels having a transfer function of $1+D^n$ or $1-D^n$. For this purpose, n such Viterbi detectors are to be used while samples of the detection signals are alternately applied to the various Viterbi detectors. This also results in the fact that the necessary operation rate of each Viterbi detector may be reduced by a factor of n.

In the detection means known from above-mentioned journal article a new value of the difference metric belonging to a new value of the detection signal is equal to a saturation function of the difference between the old difference metric and a signal that is proportional to the detection signal. A saturation function in this context is meant to denote a function which in a certain ordinate value interval is (approximately) equal to the identity function f(x)=x and which is substantially equal to a first or second saturation value respectively, for values of the ordinate situated on either one of the two sides of the interval. The saturation values are determined, for example, by the assumed properties of the channel and the norm (for example, $L_1$ or $L_2$) used for determining the difference metric.

From the new value of the difference metric there can be directly determined how the survivors are to be extended. If the new value of the difference metric is situated in the (substantially) linear interval of the saturation function, the two survivors are to be extended by a symbol that has a value equal to the value of the most recent symbol of this survivor. In the two saturation regions in which the new difference metric may be situated, the new survivors are obtained by extending the first or second survivor to two new survivors by adding thereto the two possible symbol values. There has been assumed in this context that no precoding of the symbols to be transmitted or recorded respectively, has occurred, because when precoding is used there is a possibility of combining the inverse precoding with survivor generation.

A problem of the prior-art transmission system is that it presents only optimum performance with a limited class of channels having a very specific transfer function i.e.( $1+D^n$) or ($1-D^n$).

It is an object of the invention to provide a transmission system as defined in the opening paragraph which presents optimum performance with a larger class of channels without adding to the complexity.

SUMMARY OF THE INVENTION

For this purpose, the invention is characterized, in that the new difference metric is a combination of the saturation function and a correction signal, this correction signal depending on the detection signal and on a correction parameter which is a measure of the difference between a current channel parameter and an assumed channel parameter.

By combining the saturation function based on (assumed) fixed channel properties with the correction signal compensating for the effect of the difference between the current channel parameters and assumed fixed channel parameters, a difference metric is obtained which remains representative of the difference of probability between survivors, despite the channel parameters which differ from the assumed channel parameters. This will be further explained hereinafter. The exact form of the correction term depends on the selected norm ($L_1$ or $L_2$)

U.S. Pat. No. 4,847,871 has revealed a Viterbi detector which adapts itself to the impulse response of the channel used by estimating this impulse response. However, this is not a Viterbi detector which utilizes a difference metric, as a result of which this Viterbi detector is much more complicated than the Viterbi detector according to the present invention.

An embodiment of the invention is characterized, in that the size of the ordinate value interval is proportional to an estimate of the amplitude of the detection signal.

By making the size of the (substantially) linear region proportional to an estimate of the amplitude of the detection signal, there is obtained that the data receiver continues to operate well for detection signals which have different amplitudes. As a result, the use of, for example, an AGC amplifier for keeping the input signal of the detection means constant, may be omitted.

A further embodiment of the invention is characterized, in that the detection means comprises a means for storing and adapting the difference metric in the form of at least two components and for updating the survivors on the basis of the value of the components.

By storing the difference metric in the form of at least two components there is achieved that a simpler storage means may suffice for this storage. Then it is not necessary that for each new value of the detection signal the difference metric is actually derived from the components. It is conceivable that the adaptation and evaluation of the difference metric may be effected on the basis of said components without the need of constantly determining the difference metric itself.

A further embodiment of the invention is characterized, in that the means for deriving a detection signal from the input signal comprises a means for deriving a compensation signal for intersymbol interference from one of the survivors and a channel model stored in the detection means, and for deriving the detection signal by subtraction of the compensation signal from the input signal.

By deriving the detection signal from the input signal and an intersymbol interference compensation signal derived from one of the survivors, it is possible to use the detection means for channels having an impulse response lasting longer than two symbol intervals of the detection signal, without a considerable enhancement of the complexity of the detection means.

A preferred embodiment of the invention is characterized, in that the receiver comprises an adapting means for adaptively deriving the correction parameter from the detection signal.

By adaptively deriving the value necessary for the correction parameter from the detection signal, the receiver is capable of automatically adapting itself to time-variable channels. Many methods are known for adaptively deriving channel parameters from a received input signal. A number of them are described in the title "Adaptive Digital Filters and Signal Analysis" by M. G. Bellanger, Marcel Dekker Inc., 1987, ISBN 0-8247-7788-0.

BRIEF DESCRIPTION OF THE DRAWING

The invention will now be further explained with reference to the drawing Figures in which like elements are designated by like reference characters, in which.

DESCRIPTION OF THE PREFERRED EMBODIMENT

Figure 1:
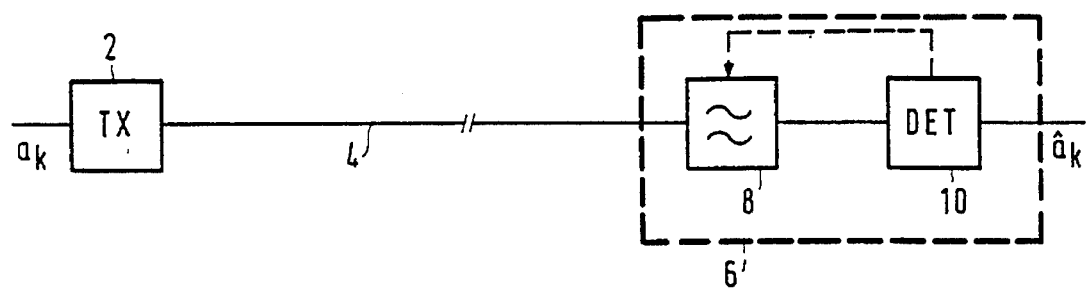
FIG. 1 shows a transmission system in which the invention can be implemented.

In the transmission system as shown in FIG. 1 a sequence of symbols $a_k$ to be transmitted is converted by a transmitter 2 into a signal suitable for transmission. This signal is fed to a channel 4. This channel may be a customary transmission channel, but also a magnetic or optical recording medium. The output signal of the channel 4 is applied to a receiver 6. In the receiver 6, a deriving means 8 for deriving a detection signal from an input signal derives a detection signal from the input signal of the receiver. The deriving means 8 habitually comprises a filter, for example, for partly suppressing intersymbol interference. The detection signal is applied to the detection means 10 which derives from the detection signal a decision $\hat{a}_k$ of the sequence of transmitted symbols. It is likewise possible for the sequence of symbols $\hat{a}_k$ to be applied to the deriving means 8 used for deriving the detection signal from the input signal.

Figure 2:
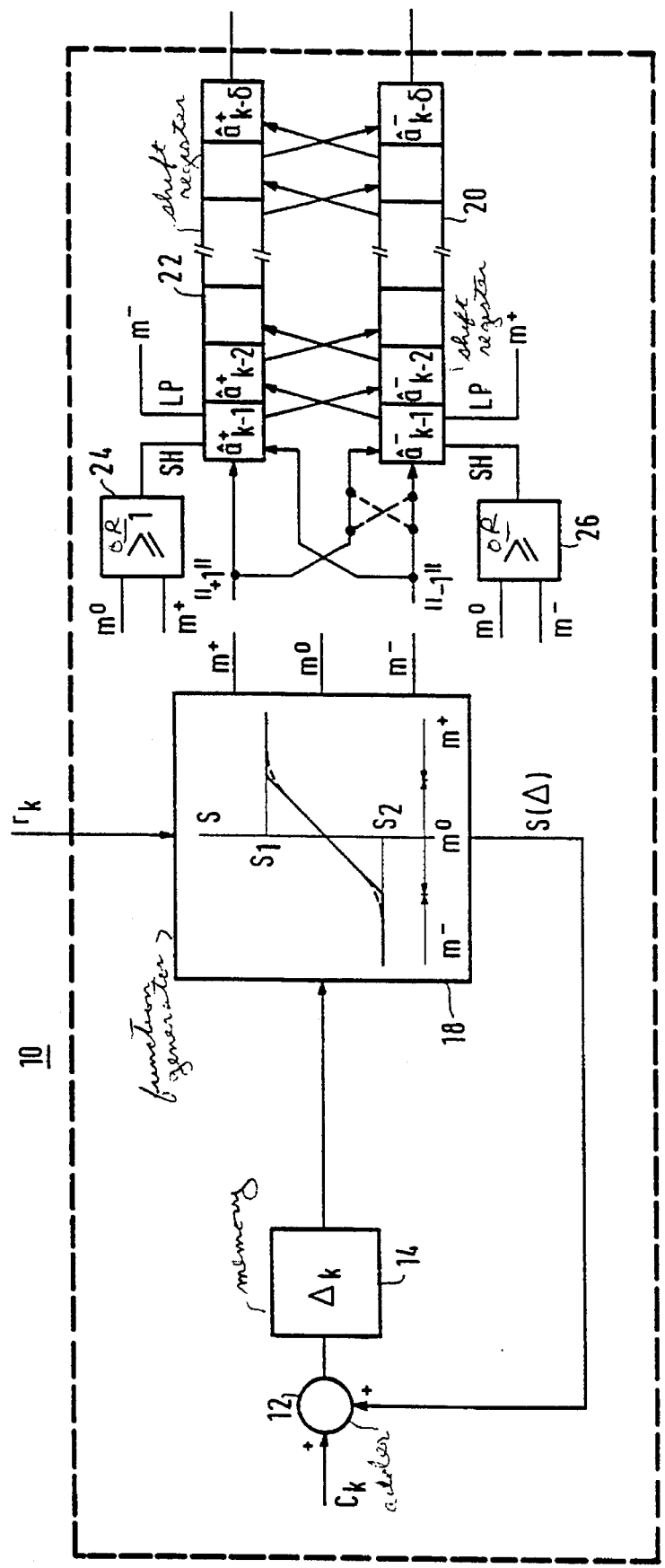
FIG. 2 shows a detection means according to the invention.

The detection means 10 as shown in FIG. 2 comprises a memory 14 for updating the difference metric $\Delta_k$. The adapting means here comprises an adder circuit 12 and a function generator 18 for generating the saturation function. The output of the memory 14 is connected to a first input of the function generator 18. The detection signal $r_k$ is applied to a second input of the function generator 18. An output of the function generator 18 carrying output signal $S(\Delta)$ is connected to a first input of an adder circuit 12. A second input of the adder circuit 12 is supplied with a correction signal $C_k$. The output of the adder circuit 12 is connected to an input of the memory 14.

A second output of the function generator 18 carrying an output signal $m^+$ is connected to a first input of an OR-gate 24 and to a control input LP of a shift register 20. A third output of the function generator 18 carrying output signal $m^-$ is connected to a first input of an OR-gate 26 and to a control input LP of a shift register 22. A fourth output of the function generator 18 carrying output signal $m^0$ is connected to a second input of the OR-gate 24 and to a second input of the OR-gate 26. The output of the OR-gate 24 is connected to a control input SH of the shift register 22. The output of the OR-gate 26 is connected to a control input SH of the shift register 20.

A fixed logic "+1" value is applied to the input of the shift register 22 and a fixed logic "−1" value is applied to the input of the shift register 20. The output of each cell of the shift register 20 is coupled to an input of a successive cell of the shift register 22, whereas the output of each cell of the shift register 22 is coupled to an input of a successive cell of the shift register 20.

The difference metric $\Delta_k$ is stored in the memory 14. The function generator derives an output signal $S(\Delta_k)$ from a stored value of the difference metric and the detection signal $r_k$. In an adder circuit 12 the output signal of the function generator is combined with a correction signal $C_k$ which is a measure for a difference of a current channel parameter from an expected channel parameter. The value of the saturation function and the correction signal will be discussed in more detail hereinafter.

The signals $m^+$, $m^0$ and $m^-$ denote how the survivors are to be extended. The logic values of $m^+$, $m^0$ and $m^-$ are determined by the region in which the signal $\Delta_k$ or $S(\Delta_k)$ is situated. If $\Delta_k$ has a value so that $S(\Delta_k)$ adopts a first (for example smallest) saturation value, then the signal $m^-$ is active. If $\Delta_k$ lies in the linear region of the saturation function, the signal $m^0$ is active. If $\Delta_k$ has a value so that $S(\Delta_k)$ adopts a second (for example largest) saturation value, the signal $m^+$ is active.

The two survivors are stored in the shift registers 20 and 22 respectively. Shift register 20 accommodates the survivor whose estimate $\hat{a}_k$ of the most recent symbol $a_k$ has a logic "−1" value, whereas shift register 22 accommodates the survivor whose estimate $\hat{a}_k$ of the most recent symbol $a_k$ has a logic "+1" value.

If the signal $m^0$ is active, the output signal of the two OR-gates 24 and 26 will be active and the control inputs SH of the two shift registers activated, so that the logic values of the input signals of the two shift registers are shifted into the relevant shift registers. This implies that the two survivors are extended by a symbol equal to the most recent but one symbol.

If the signal $m^+$ is active, the control input LP of the shift register 20 will be activated and, as a result of the output of the OR-gate 24 being activated, the control input SH of the shift register 22 will be activated. This implies that the survivor that had been stored in shift register 22 is taken over in shift register 20 but shifted by one position. In addition, the logic value of the input signal of shift register 22 is shifted into this shift register 20. This means that the two survivors are equal but for the most recent symbol. Such a situation is called a merge.

If the signal $m^-$ is active, the control input LP of the shift register 22 will be activated and, as a result of the output of the OR-gate 26 becoming active, the control input SH of the shift register 20 will be activated. This means that the survivor that had been stored in shift register 20 is taken over in shift register 22 but shifted by one position. In addition, the logic value of the input signal of shift register 20 is shifted in this shift register 20.

The decisions $\hat{a}_{k-\delta}$ delayed over $\delta$ symbol intervals and made about the symbols $\hat{a}_k$ may be tapped from the output of either shift register 20 or 22. The required memory length $\delta$ may be reduced considerably by tapping the symbols $\hat{a}_{k-\delta}$ from the shift register which at that moment accommodates the more likely survivor. This may simply be effected on the basis of the sign of the difference metric $\Delta_k$.

If $1 \oplus D$ precoding is to be used in the data transmitter of the transmission system, where $\oplus$ represents a modulo-2 addition, it is possible to recover the uncoded symbols in the receiver without the need of using a decoder. For this purpose, no more than both the input signals of the first cell of the shift register 20 (carrying contents $\hat{a}^-_{k-1}$) are to be exchanged, as is schematically shown in FIG. 2 by way of dashed lines.

Figure 3:
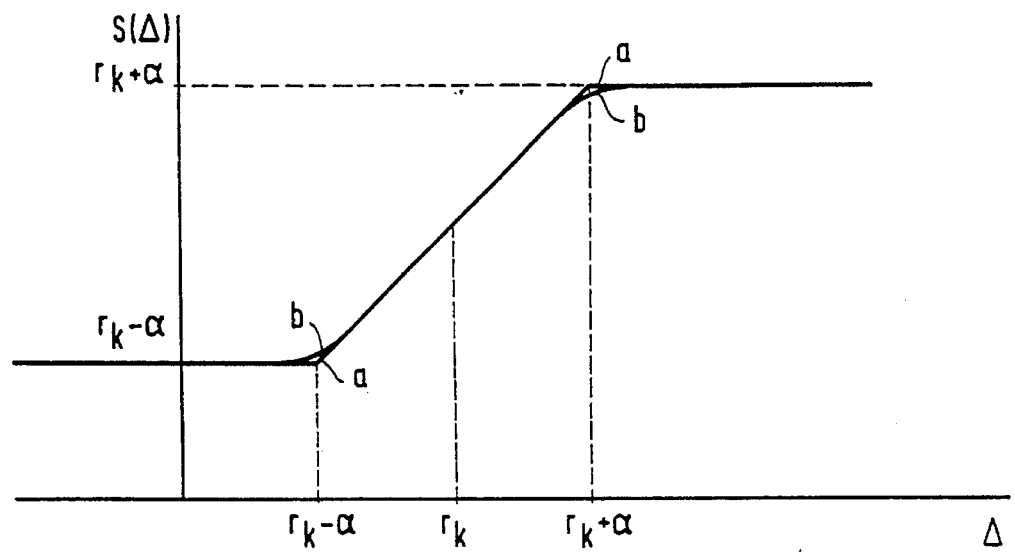
FIG. 3 shows a first saturation function to be used in the detection means as shown in FIG. 2.

FIG. 3 shows a first saturation function which can be used for a channel having a transfer function $H(D)=\alpha-\beta \cdot D$, where a and B are channel parameters and D is the notation customary in data transmission technology for a delay over one symbol period. It appears that the linear portion of the saturation function lies on the line $S(\Delta)=\Delta$ and that the saturation values are equal to $r_k+\alpha$ and $r_k-\alpha$ respectively. It is conceivable that the saturation function consisting of three straight line portions (a) is approximated by a flowing curve (b). This fact is especially advantageous if the function generator 18 is formed by analog circuits. Hereinbelow there will be shown that the saturation function shown in FIG. 3 combined with a suitable correction signal $C_k$ actually leads to an optimum determination of the symbols $\hat{a}_k$.

For deriving the saturation function there is assumed that there is a survivor $P_k^+$ whose most recent symbol has the logic "+1" value and which survivor has a probability measure $\lambda_k^+$. The other survivor $p_k^-$ has the logic "−1" value as the most recent symbol and a probability measure $\lambda_k^-$. For deriving the survivors $p_k^+$ and $p_k^-$ from the previous survivors $p_{k-1}^+$ and $p_{k-1}^-$, first the probability of the four different transition possibilities is determined. For this purpose, the $L_2$ norm is used for this derivation. If a channel transfer function $H(D)=\alpha-\beta \cdot D$ is started from, the following holds for the Euclidian weight of the four transition possibilities $\chi_{\hat{a}_{k-1}, \hat{a}_k}$:

$\chi_{+1,+1}=(r_k-\alpha+\beta)^2$ $\chi_{+1,-1}=(r_k+\alpha+\beta)^2$ $\chi_{-1,+1}=(r_k-\alpha-\beta)^2$ $\chi_{-1,-1}=(r_k+\alpha-\beta)^2$ \hfill (1)

The new survivors with associated probability measures may be found by extending the old survivors by both a +1 symbol and a −1 symbol. There are now two survivors ending in +1 and two survivors ending in −1. From the two survivors ending in +1 the survivor having the less probability is determined and stored. The same happens to the two survivors ending in −1. If the channel noise is assumed to be white noise, the new probability measures may be determined by adding the Euclidian weights to the previous probability measures. With this assumption the following holds for the probability of the remaining new survivors:

$$\lambda_k^{+1} = \text{MIN}[\lambda_{k-1}^{+1} + \chi_{+1,+1}, \lambda_{k-1}^{-1} + \chi_{-1,+1}] = \text{MIN}[\lambda_{k-1}^{+1} + (r_k - \alpha + \beta)^2, \lambda_{k-1}^{-1} + (r_k - \alpha - \beta)^2]$$

$$\lambda_k^{-1} = \text{MIN}[\lambda_{k-1}^{-1} + \chi_{-1,-1}, \lambda_{k-1}^{+1} + \chi_{+1,-1}] = \text{MIN}[\lambda_{k-1}^{-1} + (r_k + \alpha - \beta)^2, \lambda_{k-1}^{+1} + (r_k + \alpha + \beta)^2] \quad (2)$$

If a difference metric $\Delta_k$ is introduced, which is equal to $\lambda_k^{-1} - \lambda_k^{+1}$, (2) may be written as follows:

$$\Delta_k = \text{MIN}[\Delta_{k-1} + (r_k + \alpha - \beta)^2, (r_k + \alpha + \beta)^2] - \text{MIN}[\Delta_{k-1} + (r_k - \alpha - \beta)^2, (r_k - \alpha + \beta)^2] \quad (3)$$

A working-out of the quadratic terms and elimination of several terms from the MIN functions results in:

$$\Delta_k = 4\alpha r_k - 4\alpha\beta + \text{MIN}[(\Delta_{k-1}, 4\beta r_k + 4\alpha\beta] - \text{MIN}[\Delta_{k-1}, 4\beta r_k - 4\alpha\beta] \quad (4)$$

If the difference metric $\Delta_k$ is set to $4\beta\bar{\Delta}_k$, (4) changes into:

$$\bar{\Delta}_k = \frac{\alpha}{\beta} r_k - \alpha + \text{MIN}[\bar{\Delta}_{k-1}, r_k + \alpha] - \text{MIN}[\bar{\Delta}_{k-1}, r_k - \alpha] \quad (5)$$

In (5) three different regions can be distinguished for $\bar{\Delta}_{k-1}$. In a first region there holds $\bar{\Delta}_{k-1} < r_k - \alpha$. From (1) and (3) it follows that if $\bar{\alpha}_{k-1}$ is situated in this region, the two remaining survivors end in −1,+1 and −1,−1 respectively. Both survivors then have the penultimate symbol (−1) in common. This is designated as a negative merge (m⁻). In the second region it holds that $r_k - \alpha \leq \bar{\Delta}_{k-1} \leq r_k - \alpha$. From (1) and (3) it follows that the two remaining survivors end in −1,−1 and +1,+1 respectively. There is no merge which is designated as m⁰. In the third region it holds that $r_k + \alpha < \bar{\Delta}_{k-1}$, which corresponds to two survivors ending in +1,+1 and +1,−1 respectively. This is designated as a positive merge (m⁺).

An elaboration of (5) while substituting $\rho = (\alpha - \beta)/\beta$ ($\rho$ is the correction parameter according to the inventive idea) leads to the results which may be summarized in the Table below.

TABLE 1

| region | $\bar{\Delta}_k$ | merge |
|---|---|---|
| $\bar{\Delta}_{k-1} > r_k + \alpha$ | $r_k + \alpha + \rho r_k$ | m⁺ |
| $r_k - \alpha \leq \bar{\Delta}_{k-1} \leq r_k + \alpha$ | $\bar{\Delta}_{k-1} + \rho r_k$ | m⁰ |
| $\bar{\Delta}_{k-1} < r_k - \alpha$ | $r_k - \alpha + \rho r_k$ | m⁻ |

The relation between $\bar{\Delta}_{k-1}$ and $\bar{\Delta}_k$ according to the Table is the relation between $\bar{\Delta}_{k-1}$ and $\bar{\Delta}_k$ as this is given by the combination of the saturation function as shown in FIG. 3 and the correction signal. The correction signal C from FIG. 2 is here equal to $\rho r_k$.

If $\bar{\Delta}_k$ is defined as $\lambda_k^+ - \lambda_k^-$, in contrast with the assumption of $\bar{\Delta}_k = \lambda_k^- - \lambda_k^+$ which forms the basis of Table 1, the saturation function will be obtained as shown in Table 2.

TABLE 2

| region | $\bar{\Delta}_k$ | merge |
|---|---|---|
| $\bar{\Delta}_{k-1} \geq -r_k + \alpha$ | $-r_k + \alpha - \rho r_k$ | m⁺ |
| $-r_k - \alpha \leq \bar{\Delta}_{k-1} \leq -r_k + \alpha$ | $\bar{\Delta}_{k-1} - \rho r_k$ | m⁰ |
| $\bar{\Delta}_{k-1} < -r_k - \alpha$ | $-r_k - \alpha - \rho r_k$ | m⁻ |

Figure 4:
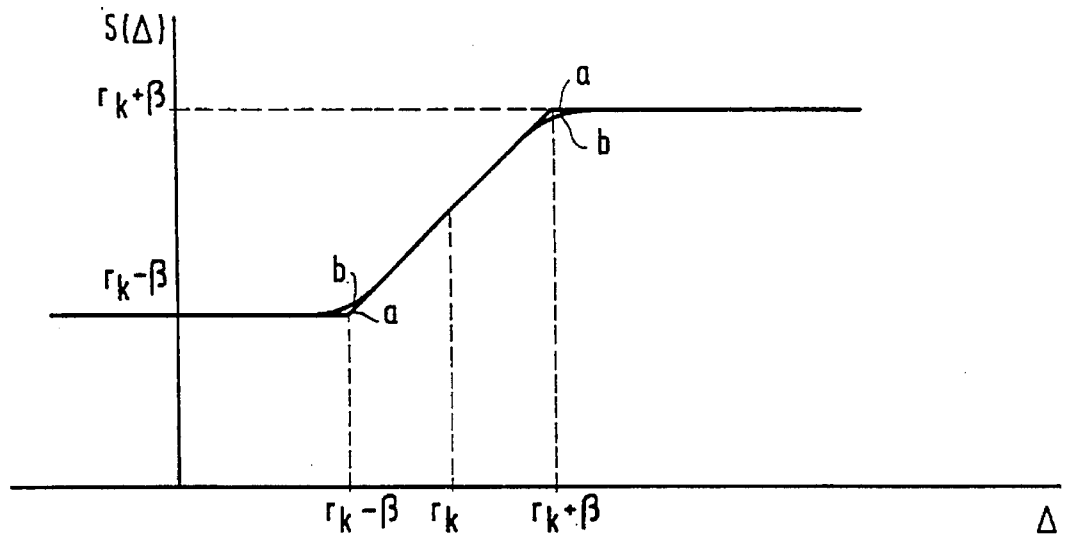
FIG. 4 shows a second saturation function to be used in the detection means as shown in FIG. 2.

FIG. 4 shows a saturation function equivalent to that of FIG. 3. The saturation function as shown in FIG. 4 may be derived from the saturation function by scaling all the signals from FIG. 2 by a factor of $\beta/\alpha$ and replacing the difference metric $\bar{\Delta}_{k-1}$ by a derived difference metric $\Delta'_{k-1}$ which is equal to $\beta \cdot \bar{\Delta}_{k-1}/\alpha + \gamma r_k$. Here $\gamma$ (the correction parameter according to the inventive idea) is equal to $(\alpha-\beta)/\alpha$. The relation between $\Delta'_{k-1}$ and $\Delta'_k$ as well as the associated extensions of the survivors will be given in the Table below.

TABLE 3

| region | $\Delta'_k$ | merge |
|---|---|---|
| $\Delta'_{k-1} > r_k + \beta$ | $r_k + \beta + \gamma r_k$ | m⁺ |
| $r_k - \beta \leq \Delta'_{k-1} \leq r_k + \beta$ | $\Delta'_{k-1} + \gamma r_k$ | m⁰ |
| $\Delta'_{k-1} < r_k - \beta$ | $r_k - \beta + \gamma r_k$ | m⁻ |

The correction signal is here equal to $\gamma r_k$.

Figure 5:
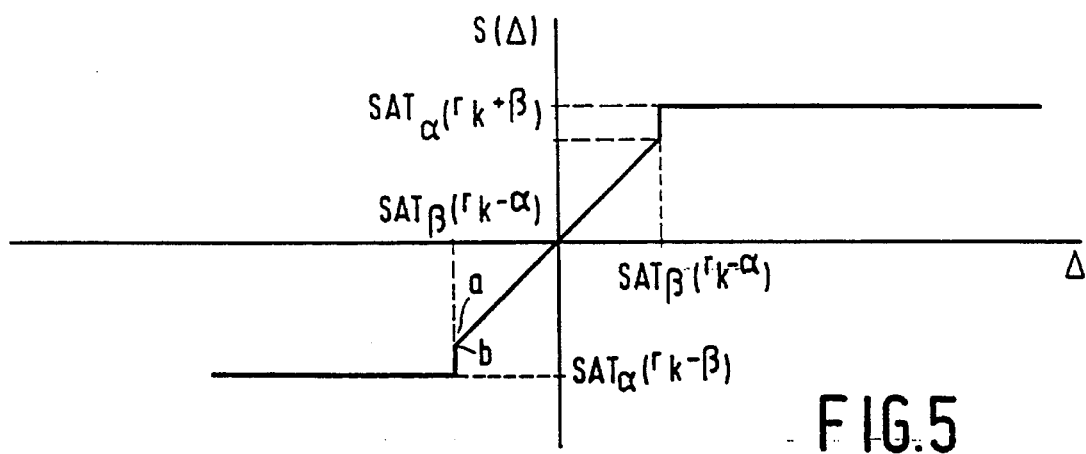
FIG. 5 shows a third saturation function to be used in the detection means as shown in FIG. 2.

FIG. 5 shows another possible saturation function. For determining the difference metric for this saturation function the $L_1$ norm in lieu of the $L_2$ norm is started from. The $L_1$ norm is equal to the absolute value of its argument in this case being the difference between the expected value of the signal $r_k$ for a specific survivor and the really occurring value of $r_k$. The Table corresponding to FIG. 5 will be given below.

TABLE 4

| region | $\Delta'_k$ | m |
|---|---|---|
| $\Delta'_{k-1} > \text{sat}_\beta(r_k + \alpha)$ | $\text{sat}_\alpha(r_k + \beta)$ | m⁺ |
| $\text{sat}_\beta(r_k - \alpha) \leq \Delta'_{k-1} \leq \text{sat}_\beta(r_k + \alpha)$ | $\Delta'_{k-1} + \frac{1}{2}(|r_k + \alpha - \beta| - |r_k - \alpha + \beta|)$ | m⁰ |
| $\Delta'_{k-1} < \text{sat}_\beta(r_k - \alpha)$ | $\text{sat}_\alpha(r_k - \beta)$ | m⁻ |

For $y \geq 0$, the function $\text{sat}_y(x)$ is defined as follows:

$x < -y$: $\text{sat}_y(x) = -y$ $-y \leq x \leq +y$: $\text{sat}_y(x) = x$ $x > +y$: $\text{sat}_y(x) = +y$ The correction signal is now only present if no merge occurs (m⁰). For large or small values respectively, of $r_k$ the saturation function degenerates according to Table 4 to a constant value of $+\alpha$ or $-\alpha$ respectively.

Figure 6:
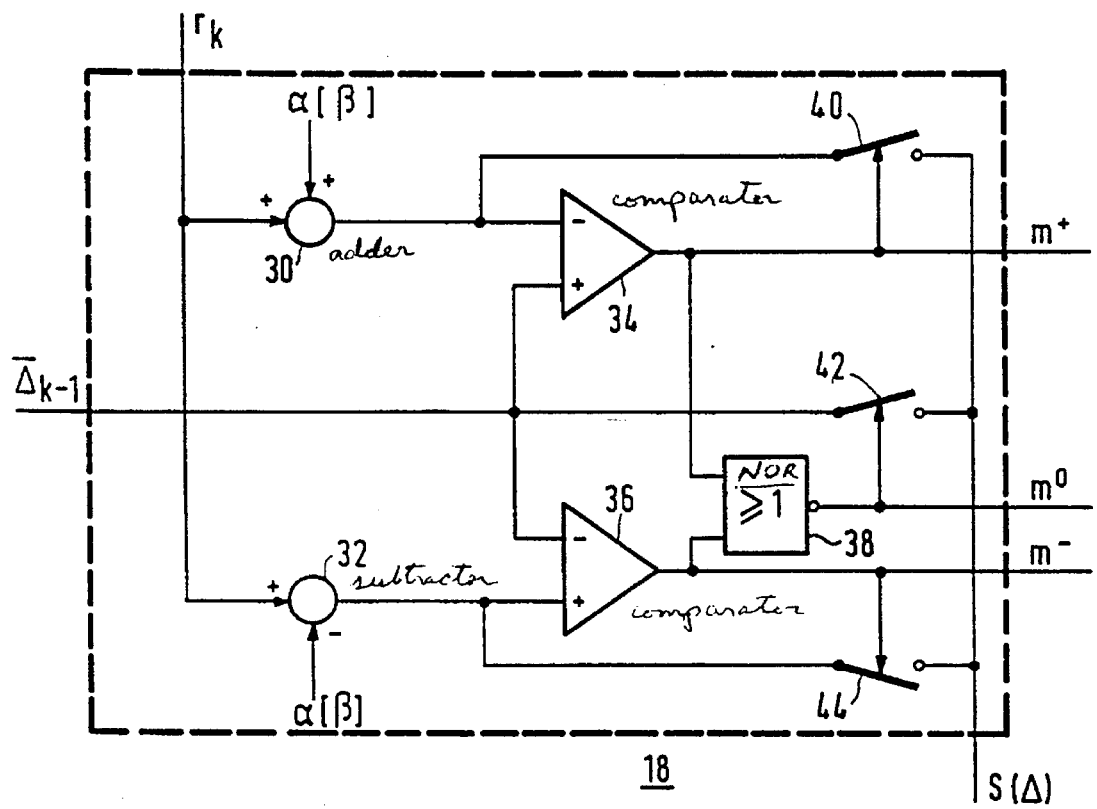
FIG. 6 shows a possible implementation of the saturation function as shown in either FIG. 3 or FIG. 4.

In the function generator 18 as shown in FIG. 6 an input carrying the signal $\bar{\Delta}_{k-1}$ is connected to a positive input of a comparator 34, a negative input of a comparator 36 and a first contact of a switch 42. An input carrying input signal $r_k$ is connected to a first input of an adder circuit 30 and to a first input of subtracter circuit 32. A second input of the adder circuit 30 is supplied with an estimate of the channel parameter α[β] if the saturation function as shown in FIG. 3 [FIG. 4] is realised. A second (negative) input of the subtracter circuit 32 is also supplied with an estimate of the channel parameter α[β].

The output of the adder circuit 30 is connected to a negative input of the comparator 34 and to a first contact of the switch 40. The output of the subtracter circuit 32 is connected to a positive input of the comparator 36 and to a first contact of the switch 44. The output of the comparator 34 carrying output signal $m^+$ is connected to a first input of a NOR-gate 38 and to a control input of the switch 40. The output of the comparator 36 carrying output signal $m^-$ is connected to a second input of the NOR-gate 38 and to a control input of the switch 44. The output of the NOR-gate 38 carrying output signal $m^0$ is connected to a control input of the switch 42. A second contact of each one of the switches 40, 42 and 44 is connected to a common junction at which the output signal of the function generator 18 is available.

The operation of the function generator 18 will now be discussed for the case where the saturation function as shown in FIG. 3 is realised. On the negative input of the comparator 34 the signal $r_k+\alpha$ is available and on the positive input of comparator 36 the signal $r_k-\alpha$ is available.

Since the signal $\overline{\Delta}_{k-1}$ is available on the positive input of the comparator 34, the output of the comparator 34 will be active if the signal $\overline{\Delta}_{k-1}$ exceeds $r_k+\alpha$. The output of comparator 36 can never be active in this situation, because $r_k-\alpha$ is always smaller than $r_k+\alpha$ for a positive α. Since the signal $m^+$ is active, the output signal $m^0$ cannot be active. Since signal $m^+$ is active, the switch 40 is closed and the output signal of the function generator is equal to $r_k+\alpha$.

The output of the comparator 36 will be active if the signal $\overline{\Delta}_{k-1}$ is smaller than $r_k-\alpha$. The output of comparator 34 can never be active in this situation, because $r_k-\alpha$ is always smaller than $r_k+\alpha$ for a positive α. Since the signal $m^-$ is active, the output signal $m^0$ cannot be active. As a result of the signal $m^-$ being active, the switch 44 is closed and the output signal of the function generator is equal to $r_k-\alpha$.

If the input signal $\overline{\Delta}_{k-1}$ lies between the values of $r_k-\alpha$ and $r_k+\alpha$, both the output of the comparator 34 and that of the comparator 36 are not active. As a result, the output of the NOR-gate 38 carrying output signal $m^0$ becomes active. Consequently, the switch 42 is closed so that the output signal of the function generator 18 becomes equal to $\overline{\Delta}_{k-1}$. For the implementation of the saturation function as shown in FIG. 5 it is furthermore necessary for the adder circuit 30 and the subtracter circuit 32 to limit the absolute value of their output signals to β.

Figure 7:
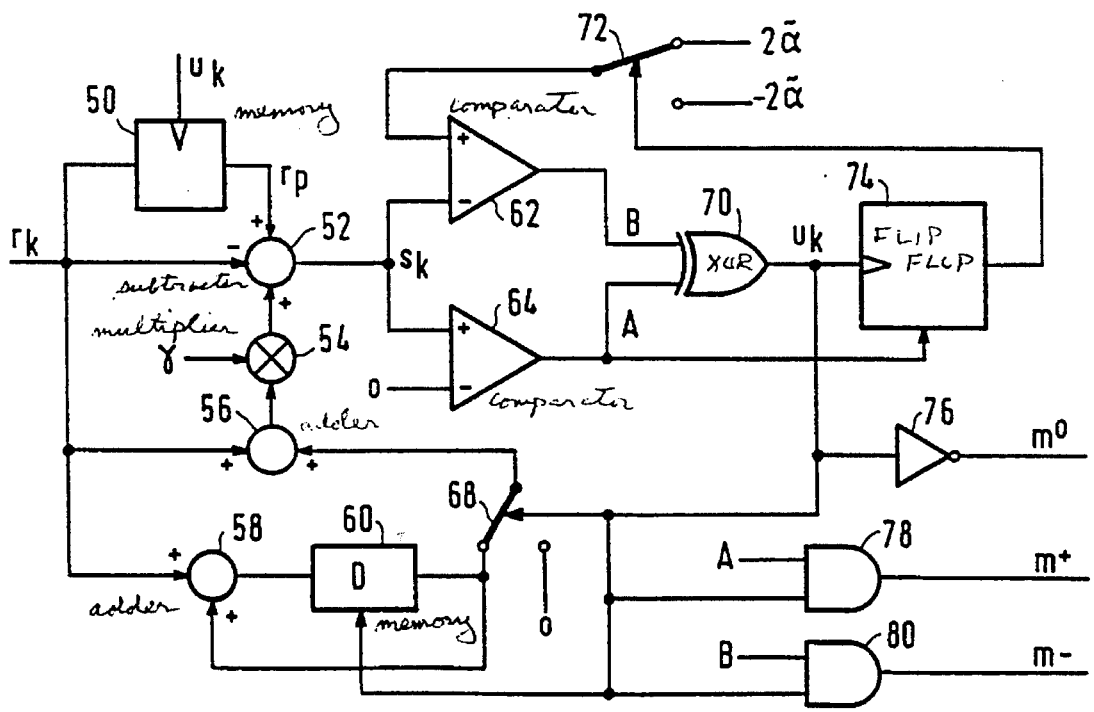
FIG. 7 shows an alternative implementation of the loop formed by the saturation function 18, the adder 12 and the memory 14 according to the invention.

In the circuit as shown in FIG. 7 the input signal $r_k$ is applied to an input of a memory circuit 50, to a negative input of a subtracter circuit 52, to a first input of an adder circuit 56 and to a first input of an adder circuit 58.

An output of the adder circuit 58 is connected to the input of a memory 60. The output of the memory 60 is connected to a break contact of a change-over switch 68 and a second input of the adder circuit 58. The active contact of the change-over switch 68 is connected to a point of constant potential which represents a signal having a reference value 0. The central contact of the change-over switch 68 is connected to a second input of the adder circuit 56. The output of the adder circuit 56 is connected to a first input of a multiplier circuit 54. A second input of the multiplier circuit 54 is supplied with an estimate of the channel parameter γ. The output of the multiplier circuit 54 is connected to a first positive input of the subtracter circuit 52. An output of the memory circuit 50 carrying output signal $r_p$ is connected to a second positive input of the subtracter circuit 52.

The output of the subtracter circuit 52 is connected to a negative input of a comparator 62 and a positive input of a comparator 64. A positive input of the comparator 62 is connected to the central contact of a change-over switch 72. A negative input of the comparator 64 is connected to the point of constant potential.

The output of the comparator 62 carrying output signal B is connected to a first input of an EXCLUSIVE OR-gate 70 and to a first input of an AND-gate 80. The output of the comparator 64 carrying output signal $\overline{A}$ is connected to an input of a flipflop 74, a second input of the EXCLUSIVE OR-gate 70 and a first input of an AND-gate 78. The output of the EXCLUSIVE OR-gate 70 carrying output signal $u_k$ is connected to a clock input of the flipflop 74, an input of an inverter 76, the control input of the change-over switch 68, a second input of the AND-gate 78, a second input of an AND-gate 80 and to a reset input of the memory 60. The output of the flipflop 74 is connected to a control input of the change-over switch 72. An estimate of the channel parameter β is applied to a break contact of the change-over switch 72, whereas the sign-inverted estimate of β is applied to an active contact of the change-over switch 72. At the output of the inverter 76 the signal $m^0$ is available. At the output of the AND-gate 78 the signal $m^+$ is available, whereas the output of the AND-gate 80 presents the signal $m^-$.

The implementation as shown in FIG. 7 is based on storing the difference metric in the form of three components whilst Table 3 is started from. This implementation additionally utilizes the fact that the value of $\Delta'_k$ is determined by the value of $r_k$ at the instant k=p at which the last merge has occurred and by the type of this merge ($m^+$ or $m^-$). For the value of $\Delta'_k$ it then holds: $\Delta'_k = r_p + \beta \cdot \epsilon_p + C_k$. Herein $r_p$ is the value of r at the instant of the merge, $\epsilon_p$ is the sign of the merge which is positive with $m^+$ and negative with $m^-$, and $C_k$ is the correction signal according to the inventive idea. The stored magnitudes are now $r_p$, $\epsilon_p$ and $C_{k-1}$. The relation between old and new values of $r_p$, $\epsilon_p$ and $C_k$ is then given by the following Table:

TABLE 5

| $s_k = r_p - r_k + C_{k-1} + \gamma r_k$ | $r_p$ | $\epsilon_p$ | $C_k$ | merge |
|---|---|---|---|---|
| $s_k > \beta(1-\epsilon_p)$ | $r_k$ | +1 | $\gamma r_k$ | $m^+$ |
| $\beta(-1-\epsilon_p) \leq s_k \leq \beta(-1+\epsilon_p)$ | $r_p$ | $\epsilon_p$ | $C_{k-1} + \gamma r_k$ | $m^0$ |
| $s_k < \beta(-1-\epsilon_p)$ | $r_k$ | −1 | $\gamma r_k$ | $m^-$ |

The signal $r_p$ is saved by means of memory 50. If them is a merge, the clock input of memory 50 is activated and the value of $r_k$ then valid is taken over as the new value $r_p$. The adder circuit 58, the memory 60, the switch 68, the adder circuit 56 and the multiplier circuit 54 assist in determining the correction signal. The output of the memory 60 presents the sum of the values of $r_k$ that have occurred after the most recent merge. This output signal may be written as:

$$X_k = \sum_{i=p}^{i=k-1} r_k \qquad (7)$$

If there is no merge ($m^0$), the correction signal is equal to:

$$C_k = \gamma \left( r_k + \sum_{i=p}^{i=k-1} r_i \right) = \gamma \sum_{i=p}^{i=k} r_i \qquad (8)$$

If there has been a merge ($m^+$ or $m^-$), the correction signal $C_k$ is equal to $\gamma r_k$, because the change-over switch 68 is switched to a reference voltage which represents a zero signal. The signal $r_p - r_k + C_k$ is then available at the negative input of the comparator 62 and at the positive input of the comparator 64. The value of $+2\beta$ is available at the positive input of the comparator 62 if the most recent merge has been an $m^+$ merge, and the value of $-2\beta$ if the most recent merge has been an $m^-$ merge.

For the case where the signal $s_k$ is situated between the two thresholds for the comparators 62 and 64, the output signals of the respective comparators 62 and 64 remain the same and the signal $u_k$ remains inactive. In that case there has been no merge ($m^0$). As a result, $r_p$ and $\epsilon_p$ retain their previous value. The correction signal is adapted according to (8). The output signal of the inverter 76 is active and shows that there has been no merge.

If the value of $s_k$ exceeds the top threshold of the comparators 62 and 64, the output signal of the comparator 62 is inactive and the output signal of the comparator 64 is active. The output of the EXCLUSIVE OR-gate 70 is then also active. In that case there has been a positive merge ($m^+$). The logic value of the signal A is clocked with the signal $u_k$ in the flipflop 74, so that $\epsilon$ is now equal to $+1$. The switch 72 is switched to the input signal $+2\beta$. The switch 68 is also switched, so that the next correction signal equals $\gamma r_k$. In addition, the memory 60 is reset, so that the summation of $r_k$ may now start from the new value of p. The output signal of the AND-gate 78 is now active to denote that there has been a positive merge.

If the value of $s_k$ falls short of the bottom threshold of the comparators 62 and 64, the output signal of the comparator 62 is active and the output signal of the comparator 64 inactive. The output of the EXCLUSIVE OR-gate 70 is then active. A negative merge ($m^-$) has then occurred. The logic value of the signal A is clocked with the signal $u_k$ in the flipflop 74, so that $68_p$ is now equal to $-1$. The switch 72 is switched to the input signal $-2\beta$. In accordance with a positive merge the switch 68 is switched over and the memory 60 reset. The output signal of the AND-gate 80 is now active to denote that there has been a negative merge.

Figure 8:
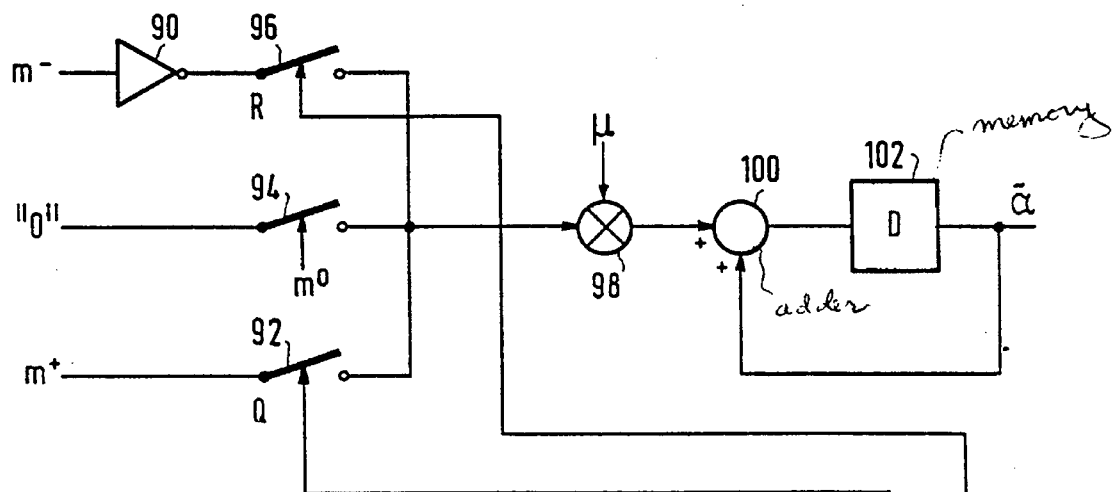
FIG. 8 shows a circuit for determining an estimate of the channel parameter $\alpha$.
Figure 8:
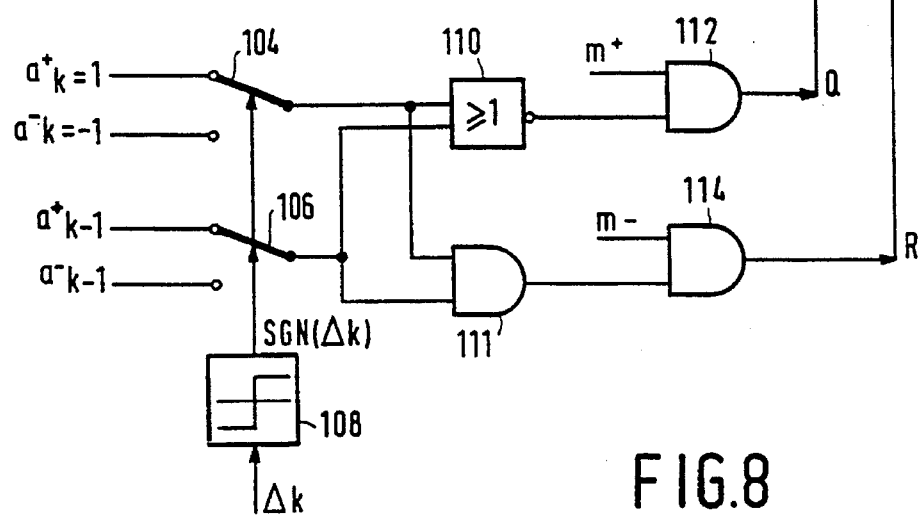

In the circuit as shown in FIG. 8 the signal $m^+$ is applied to a first contact of a switch 92, a potential corresponding to a signal equal to 0 is applied to a first contact of a switch 94 and the signal ($m^-$) is applied to a switch 96 via an inverter 90. The signals $m^+$ and $m^-$ are the output signals of the respective comparators 34 and 36 shown in FIG. 6 or the output signals $m^+$ or $m^-$ respectively, shown in FIG. 7.

A second contact of the switches 92, 94 and 96 is connected to a first input of a multiplier circuit 98. A multiplication factor $\mu$ is applied to a second input of the multiplier circuit 98. The output of the multiplier circuit 98 is connected to a first input of an adder circuit 100. The output of the adder circuit 100 is connected to the input of a memory 102, whereas the output of the memory 102 is connected to a second input of the adder circuit 100.

A signal $a^+_k$ is applied to a break contact of a change-over switch 104, whereas a signal $a^-_k$ applied to an active contact of the change-over switch 104. A signal $a^+_{k-1}$ is applied to a break contact of a change-over switch 106, whereas a signal $a^-_{k-1}$ is applied to an active contact of the change-over switch 106. The signals $a^+_k$, $a^-_k$, $a^+_{k-1}$ and $a^-_{k-1}$ originate from the two shift registers 22 and 20 in FIG. 2.

The central contacts of the switches 104 and 106 are connected each to an associated input of a NOR-gate 110 and to an associated input of an AND-gate 111. The output of gate 110 is connected to a first input of an AND-gate 112. The output of AND-gate 111 is connected to a first input of an AND-gate 114. A second input of the AND-gate 112 is supplied with the signal $m^+$, whereas a second input of the AND-gate 114 is supplied with the signal $m^-$. The output of the AND-gate 112 is connected to a control input of the switch 92. The output of the AND-gate 114 is connected to a control input of the switch 96. The signal $m^0$ is applied to the control input of the switch 94.

The signal $\Delta_k$ coming from the output of the memory circuit 14 in FIG. 2 is applied to a decision circuit 108. The output of the decision circuit 108 is connected to control inputs of the switches 104 and 106.

If $\tilde{\alpha}$ is assumed to be an estimate of the amplitude of the detection signal $\alpha$ and, moreover, $\beta$ is assumed to be equal to $\alpha$, in the absence of noise the following may be derived for $\Delta_k$ for the case where there is a merge at the instant k–1:

$$\Delta_k = \alpha a_{k-1} + (\tilde{\alpha} - \alpha) a_{k-2} \qquad (9)$$

If the signals $d_k^+ = \Delta_k - r_k - \tilde{\alpha}$ and $d_k^- = \Delta_k - r_k + \tilde{\alpha}$ respectively, are fed a substitution for (9) will yield for these signals:

$$d_k^+ = \alpha a_{k-1} + (\tilde{\alpha} - \alpha) a_{k-2} - \alpha(a_k - a_{k-1}) - \tilde{\alpha}$$

$$d_k^- = \alpha a_{k-1} + (\tilde{\alpha} - \alpha) a_{k-2} - \alpha(a_k - a_{k-1}) + \tilde{\alpha} \qquad (10)$$

For the situations where $-a_{k-2} = a_{k-1} = a_k = 1$ and $-a_{k-2} = a_{k-1} = a_k = -1$ respectively, there may be written for $d_k^-$ and $-d_k^+$ respectively:

$$-a_{k-2} = a_{k-1} = a_k = +1: d_k^+ = 2(\tilde{\alpha} - \alpha)$$

$$-a_{k-2} = a_{k-1} = a_k = -1: -d_k^- = 2(\tilde{\alpha} - \alpha) \qquad (11)$$

The signals $d_k^+$ and $d_k^-$ may be used for deriving an error signal which is a measure for the difference between the estimate of $\alpha$ and the real value of $\alpha$. This error signal may again be used for adapting the estimated value of $\alpha$. Instead of using the error signal determined in (11), also its sign may be used for determining the error signal. The advantage of this is that the signs of $d_k^+$ and $d_k^-$ are immediately available in the form of the signals $m^+$ and $m^-$ respectively, whilst these signals may adopt the value of $+1$ and $-1$ respectively.

The control signals Q, $m^0$ and R determine which of the switches 92, 94 or 96 is closed. If there has been no merge at the instant k–1, switch 94 is closed and no adaptation of $\tilde{\alpha}$ is made. If signal Q or signal R respectively, is active, switch 92 or 96 respectively, is closed. Due to the presence of the inverter 90, there is a signal according to (11) available at the input of the multiplier circuit 98 in both situations. The multiplier circuit 98, the adder circuit 100 and the memory form the implementation of the prior-art sign algorithm for determining $\tilde{\alpha}$. The AND-gate 112 produces the signal A if there has been a positive merge and if the two most recent symbols of the most likely survivor were equal to $-1$. This corresponds to $-a_{k-2} = a_{k-1} = a_k = -1$. The AND-gate 114 produces the signal B if there has been a negative merge and if the two most recent symbols of the most likely survivor were equal to $+1$. This corresponds to $-a_{k-2} = a_{k-1} = a_k = 1$. The two most recent symbols of the most likely survivor are available at the central contacts of the change-over switches 104 and 106. The most likely survivor is determined by taking the sign of the signal $\Delta_k$ by means of the decision switch 108. The output signal of this decision switch 108 activates the switches 104 and 106 so that the most recent symbols of the most likely survivor are connected to the central contacts of the switches 104 and 106.

For determining an estimate of the channel parameter $\beta$, an error signal $e_k$ equal to:

$$e_k = r_k - \bar{\alpha} a_k + \bar{\beta} a_{k-1} \tag{12}$$

is started from. If an estimate of $\tilde{\gamma}$ of $\gamma$ is assumed to be: $\tilde{\gamma} = (\bar{\alpha} - \bar{b})/\bar{\alpha}$, it follows that $\bar{\alpha} = \bar{b}/(1-\tilde{\gamma})$. Substitution of this in (12) leads to:

$$e_k = r_k - \frac{\bar{\beta}}{1-\tilde{\gamma}} + \bar{\beta} a_{k-1} \tag{13}$$

Dividing (13) by $1-\tilde{\gamma}$ yields:

$$e'_k = (1-\tilde{\gamma})e_k = (1-\tilde{\gamma})(r_k + \bar{\beta}) - \bar{\beta} a_k \tag{14}$$

The advantage of the use of such an error signal is that no digital multiplications need be performed if $\tilde{\gamma}$ is a power of 2. The multiplication required may then be made in the form of a shift operation which is much simpler to realise, as a result of which the implementation of (14) becomes much simpler.

According to the known LMS algorithm, an estimate $\bar{\beta}$ of $\beta$ may be obtained by:

$$\bar{\beta}_k = \bar{\beta}_{k-1} + \mu e_k(\hat{a}_k - (1-\tilde{\gamma})\hat{a}_{k-1}) \tag{15}$$

Since $\tilde{\gamma}$ is often considerably smaller than 1, (15) may be approximated by:

$$\bar{\beta}_k \beta \bar{\beta}_{k-1} + \mu e'_k(\hat{a}_k - \hat{a}_{k-1}) \tag{16}$$

A further simplification is obtained by the use of the sign algorithm. (16) then changes into:

$$\hat{a}_k \neq \hat{a}_{k-1}: \bar{\beta}_k = \bar{\beta}_{k-1} \mu' \text{sgn}(e_k)\hat{a}_k$$

$$\hat{a}_k = \hat{a}_{k-1}: \bar{\beta}_k = \bar{\beta}_{k-1}$$

$\tilde{\gamma}$ may be determined with the aid of the LMS algorithm for which $\mu e_k \hat{a}_k$ may be used as an adaptation signal. If $\tilde{\gamma}$ is limited to powers of 2, not the LMS or sign algorithm may be used for the adaptive determination, because in that case the minor adaptations bring $\gamma$ outside the set of permitted values.

A solution to this is determining an average over N values of $e_k \hat{a}_k$ where N is of the order of 100 to 1000. If this average lies above a first threshold, $\tilde{\gamma}$ is increased by a factor of 2 and if this average lies below a second threshold, $\tilde{\gamma}$ is reduced by a factor of 2. This increasing or reducing may be simply effected by a shift operation. In this manner $\tilde{\gamma}$ will eventually obtain the value at which the mean squared value of the error signal is minimized.

If the channel has an impulse response that has a size exceeding two symbol intervals, it is possible to combine the relatively simple Viterbi detector with a decision feedback circuit. Combining a Viterbi detector with a decision feedback circuit is known per se from the journal article "On the use of decision feedback for simplifying the Viterbi detector" by J. W. M. Bergmans et al., in Philips Journal of Research, Vol. 42, No. 4, 1987, pp. 399–428.

We claim:

1. Transmission system comprising a data transmitter for supplying with a symbol interval data symbols to an input of a channel and a data receiver comprising a means for deriving a detection signal from an output signal of the channel, detection means for calculating a difference metric which is a measure of the probability of difference of two candidate sequences of data symbols (survivors), deriving the most likely sequence of data symbols carried by the detection signal from the detection signal by recursively updating the two survivors based on the value of the difference metric, the detection means further comprising adapting means for determining a saturation function of the previous difference metric and for determining the difference between current channel parameters and an assumed channel parameter and for calculating a correction parameter based on the difference between the current channel parameter and the assumed channel parameter and for updating the difference metric to generate a new difference metric depending on the saturation function of the previous difference metric, and the saturation function for an ordinate value interval being equal to an identity function, characterized in that the new difference metric is a combinaton of the saturation function and the correction signal.

2. Transmission system as claimed in claim 1, comprising means for estimating the amplitude of the detection signal and in which the size of the ordinate value interval is proportional to the estimate of the amplitude of the detection signal.

3. Transmission system as claimed in claim 1, characterized in that the detection means comprises a means for storing and adapting the difference metric in the form of at least two components and for updating the survivors on the basis of the value of the components.

4. Transmission system as claimed in claim 1, characterized in that the means for deriving a detection signal from the output signal comprises a means for deriving a compensation signal for intersymbol interference from one of the survivors and a channel model stored in the detection means, and for deriving the detection signal by subtraction of the compensation signal from the output signal.

5. Transmission system as claimed in claim 4, characterized in that means for deriving a detection signal from the output signal is arranged for deriving a detection signal for each survivor based on that specific survivor.

6. Transmission system as claimed in claim 1, characterized in that the receiver comprises an adapting means for adaptively deriving the correction parameter from the detection signal.

7. Transmission system as claimed in claim 6, in which the correction parameter is a power of two, and the adapting means comprising a summing means for summing a number of estimates of the error in the correction parameter, and comprising an adapting means for adapting the correction parameter when the sum is situated outside a region associated to the relevant value of the correction parameter.

8. Data receiver comprising a means for deriving a detection signal from a channel output signal, detection means for deriving from the detection signal the most likely sequence of data symbols carried by the detection signal by calculating the value of a difference metric which is a measure of the difference of probability of two candidate data sequences (survivors) and recursively updating the two candidate data sequences (survivors) on the basis of the value of the difference metric, the detection means further comprising an adapting means for determining a correction parameter from the difference between a current channel parameter and an assumed channel parameter and updating the difference metric, to generate a new difference metric depending on a saturation function of the previous difference metric and a correction signal, this correction signal depending on the detection signal and on the correction parameter and the saturation function for an ordinate value interval being equal to an identity function.

9. Receiver as claimed in claim 8, comprising means for estimating the amplitude of the detection signal and in which the size of the ordinate value interval is proportional to the estimate of the amplitude of the detection signal.

10. Receiver as claimed in claim 8, characterized in that the receiver comprises an adapting means for adaptively deriving the correction parameter from the detection signal.

* * * * *